(12) United States Patent
Nagatomi et al.

(10) Patent No.: US 8,308,981 B2
(45) Date of Patent: Nov. 13, 2012

(54) PHOSPHOR AND MANUFACTURING METHOD FOR THE SAME, AND LIGHT SOURCE

(75) Inventors: Akira Nagatomi, Tokyo (JP); Shuji Yamashita, Tokyo (JP); Tetsuya Ikuta, Tokyo (JP)

(73) Assignees: Dowa Electronics Materials Co., Ltd., Tokyo (JP); Nichia Corporation, Tokushima (JP)

( * ) Notice: Subject to any disclaimer, the term of this patent is extended or adjusted under 35 U.S.C. 154(b) by 0 days.

(21) Appl. No.: 12/801,658

(22) Filed: Jun. 18, 2010

(65) Prior Publication Data

US 2010/0258766 A1 Oct. 14, 2010

Related U.S. Application Data

(62) Division of application No. 12/292,889, filed on Nov. 28, 2008, now Pat. No. 7,803,286, which is a division of application No. 11/211,751, filed on Aug. 26, 2005, now Pat. No. 7,476,338.

(30) Foreign Application Priority Data

Aug. 27, 2004 (JP) ................................ 2004-248405
Mar. 31, 2005 (JP) ................................ 2005-105126

(51) Int. Cl.
*C09K 11/60* (2006.01)
*H01L 33/00* (2010.01)
(52) U.S. Cl. .............................................. 252/301.4 F
(58) Field of Classification Search ............ 252/301.4 F, 252/301.6 F
See application file for complete search history.

(56) References Cited

U.S. PATENT DOCUMENTS

| | | | |
|---|---|---|---|
| 18,985 | A | 12/1857 | Olds |
| 2,121,275 | A | 6/1938 | Zober et al. |
| 3,527,595 | A | 9/1970 | Adler et al. |
| 3,697,301 | A | 10/1972 | Donofrio et al. |
| 4,477,689 | A | 10/1984 | Ogasahara et al. |
| 4,576,736 | A | 3/1986 | Harmuth |
| 4,716,335 | A | 12/1987 | Schutten et al. |
| 5,398,398 | A | 3/1995 | Williams et al. |

(Continued)

FOREIGN PATENT DOCUMENTS

EP 0 459 156 A2 4/1991

(Continued)

OTHER PUBLICATIONS

K. Uheda et al., "The Crystal Structure and Photoluminescence Properties of a New Red Phosphor, Calcium Aluminum Silicon Nitride Doped With Divalent Europium," Abs. 2073, 206th Meeting., Oct. 3, 2004.

(Continued)

*Primary Examiner* — Carol M Koslow
(74) *Attorney, Agent, or Firm* — Foley & Lardner LLP

(57) ABSTRACT

A phosphor, which is given by a general composition formula expressed by $M_mA_aD_dO_oN_n:Z$, (wherein element M is at least one kind of element having bivalent valency, element A is at least one kind of element having tervalent valency selected from the group consisting of Al, Ga, In, Tl, Y, Sc, P, As, Sb, and Bi, element D is Si and/or Ge, O is oxygen, N is nitrogen, and element Z is at least one kind of element selected from rare earth elements or transitional metal elements, satisfying $m>0$, $a>0$, $b>0$ $o\geq0$, and $n=2/3$ $m+a+4/3b-2/3o$), where a content of the element Fe is smaller than 200 ppm.

6 Claims, 6 Drawing Sheets

U.S. PATENT DOCUMENTS

| | | | |
|---|---|---|---|
| 5,447,291 | A | 9/1995 | Sandhage |
| 5,600,202 | A | 2/1997 | Yamada et al. |
| 6,180,029 | B1 | 1/2001 | Hampden-Smith et al. |
| 6,504,297 | B1 | 1/2003 | Heo et al. |
| 6,670,748 | B2 | 12/2003 | Ellens et al. |
| 7,138,756 | B2 | 11/2006 | Gotoh et al. |
| 7,252,788 | B2 | 8/2007 | Nagatomi et al. |
| 7,273,568 | B2 | 9/2007 | Nagatomi et al. |
| 7,345,418 | B2 | 3/2008 | Nagatomi et al. |
| 7,432,647 | B2 | 10/2008 | Nagatomi et al. |
| 7,470,378 | B2 | 12/2008 | Hirosaki |
| 7,476,337 | B2 | 1/2009 | Sakane et al. |
| 7,476,338 | B2 * | 1/2009 | Sakane et al. ........... 252/301.4 F |
| 7,507,354 | B2 | 3/2009 | Oshio |
| 7,517,748 | B2 | 4/2009 | Williams et al. |
| 7,537,710 | B2 | 5/2009 | Oshio |
| 2002/0043926 | A1 | 4/2002 | Takahashi et al. |
| 2003/0030038 | A1 | 2/2003 | Mitomo et al. |
| 2003/0030368 | A1 | 2/2003 | Ellens et al. |
| 2003/0094893 | A1 | 5/2003 | Ellens et al. |
| 2003/0132422 | A1 | 7/2003 | Tian et al. |
| 2003/0152804 | A1 | 8/2003 | Miura et al. |
| 2003/0213611 | A1 | 11/2003 | Morita |
| 2004/0155225 | A1 | 8/2004 | Yamada et al. |
| 2004/0263074 | A1 | 12/2004 | Baroky et al. |
| 2005/0001225 | A1 | 1/2005 | Yoshimura et al. |
| 2005/0189863 | A1 | 9/2005 | Nagatomi et al. |
| 2005/0203845 | A1 | 9/2005 | Yoshimine et al. |
| 2005/0205845 | A1 | 9/2005 | Delsing et al. |
| 2005/0253500 | A1 | 11/2005 | Gotoh et al. |
| 2005/0267243 | A1 | 12/2005 | Amasaki et al. |
| 2006/0006782 | A1 | 1/2006 | Nagatomi et al. |
| 2006/0021788 | A1 | 2/2006 | Kohayashi et al. |
| 2006/0022573 | A1 | 2/2006 | Gotoh et al. |
| 2006/0033083 | A1 | 2/2006 | Sakane et al. |
| 2006/0043337 | A1 | 3/2006 | Sakane et al. |
| 2006/0045832 | A1 | 3/2006 | Nagatomi et al. |
| 2006/0065878 | A1 | 3/2006 | Sakane et al. |
| 2006/0076883 | A1 | 4/2006 | Himaki et al. |
| 2006/0091790 | A1 | 5/2006 | Nagatomi et al. |
| 2006/0170332 | A1 | 8/2006 | Tamaki et al. |
| 2006/0197432 | A1 | 9/2006 | Nagatomi et al. |
| 2006/0197439 | A1 | 9/2006 | Sakane et al. |
| 2006/0220047 | A1 | 10/2006 | Nagatomi et al. |
| 2006/0220520 | A1 | 10/2006 | Sakane et al. |
| 2006/0244356 | A1 | 11/2006 | Nagatomi et al. |
| 2007/0007494 | A1 * | 1/2007 | Hirosaki et al. ....... 252/301.4 R |
| 2007/0029525 | A1 | 2/2007 | Gotoh et al. |
| 2007/0164308 | A1 | 7/2007 | Yoshimura et al. |
| 2009/0236963 | A1 | 9/2009 | Nagatomi et al. |

FOREIGN PATENT DOCUMENTS

| | | |
|---|---|---|
| EP | 1 278 250 A2 | 1/2003 |
| EP | 1 296 376 A2 | 3/2003 |
| EP | 1296383 * | 3/2003 |
| EP | 1 445 295 A1 | 8/2004 |
| JP | A-05-015655 | 1/1993 |
| JP | A-05-198433 | 8/1993 |
| JP | A-11-144938 | 5/1999 |
| JP | A-11-277527 | 10/1999 |
| JP | A-2000-073053 | 3/2000 |
| JP | A-2000-153167 | 6/2000 |
| JP | A-2001-214162 | 8/2001 |
| JP | A-2002-363554 | 12/2002 |
| JP | A-2003-013059 | 1/2003 |
| JP | A-2003-096446 | 4/2003 |
| JP | A-2003-124527 | 4/2003 |
| JP | A-2003-515655 | 5/2003 |
| JP | A-2003-277746 | 10/2003 |
| JP | A-2003-336059 | 11/2003 |
| JP | A-2004-055536 | 2/2004 |
| JP | A-2004-055910 | 2/2004 |
| JP | A-2004-505470 | 2/2004 |
| JP | A-2004-067837 | 3/2004 |
| JP | A-2004-145718 | 5/2004 |
| JP | A-2004-186278 | 7/2004 |
| JP | A-2004-189997 | 7/2004 |
| JP | A-2004-235598 | 8/2004 |
| JP | A-2004-244560 | 9/2004 |
| JP | A-2005-344025 | 12/2005 |
| JP | A-2006-028295 | 2/2006 |
| JP | 2006-063214 * | 3/2006 |
| JP | A-2006-063214 | 3/2006 |
| JP | A-2006-070109 | 3/2006 |
| JP | A-2006-176546 | 6/2006 |
| JP | 2006-282872 * | 10/2006 |
| WO | WO 01/40403 A1 | 6/2001 |
| WO | WO 02/11214 A1 | 2/2002 |
| WO | WO 2004/030109 A1 | 4/2004 |
| WO | WO 2004/039915 A1 | 5/2004 |
| WO | WO 2004/055910 A1 | 7/2004 |
| WO | WO 2005/033247 | 5/2005 |
| WO | WO 2005/049763 | 6/2005 |
| WO | WO 2005/052087 * | 6/2005 |
| WO | WO 2005/052087 A1 | 6/2005 |

OTHER PUBLICATIONS

U.S. Appl. No. 10/984,772, filed Nov. 10, 2004, Akira Nagatomi et al.
U.S. Appl. No. 11/061,669, filed Feb. 22, 2005, Akira Nagatomi et al.
U.S. Appl. No. 11/063,847, filed Feb. 23, 2005, Kenji Sakane et al.
U.S. Appl. No. 11/149,317, filed Jun. 10, 2005, Akira Nagatomi et al.
U.S. Appl. No. 11/149,192, filed Jun. 10, 2005, Kenji Sakane et al.
U.S. Appl. No. 11/198,281, filed Aug. 8, 2005, Akira Nagatomi et al.
U.S. Appl. No. 11/194,590, filed Aug. 2, 2005, Masahiro Gotoh et al.
U.S. Appl. No. 11/182,190, filed Jul. 15, 2005, Kenji Sakane et al.
U.S. Appl. No. 11/218,504, filed Sep. 6, 2005, Akira Nagatomi et al.
Nov. 23, 2009 Office Action issued in U.S. Appl. No. 12/285,295.
English translation of paragraph 5 of "Phosphor Handbook" (compiled by Phosphor Research Society, published by Ohmusha, Ltd., 1987); pp. 172-176.

* cited by examiner

FIG. 1

| | COMPOSITION FORMULA | BN ADDITION (wt%) | BORON CONTENT (wt%) | PEAK WAVELENGTH (nm) | RELATIVE EMISSION INTENSITY (%) | CHROMATICITY x | CHROMATICITY y | PARTICLE SIZE (μm) | BET (m²/g) |
|---|---|---|---|---|---|---|---|---|---|
| COMPARATIVE EXAMPLE 1 | Ca$_{0.985}$AlSiN$_3$:Eu$_{0.015}$ | 0.0 | <0.0001 | 651.5 | 100.0 | 0.653 | 0.346 | 5.851 | 1.087 |
| EXAMPLE 1 | | 0.1 | 0.063 | 656.2 | 116.2 | 0.674 | 0.325 | 5.003 | 0.985 |
| EXAMPLE 2 | | 0.5 | 0.170 | 654.7 | 119.1 | 0.675 | 0.325 | 5.676 | 0.945 |
| EXAMPLE 3 | | 1.0 | 0.310 | 654.0 | 119.6 | 0.675 | 0.325 | 5.646 | 0.918 |
| EXAMPLE 4 | | 2.0 | 0.640 | 656.0 | 117.1 | 0.676 | 0.323 | 10.58 | 1.015 |

FIG. 3

| | COMPOSITION FORMULA | CaF$_2$ ADDITION (mol) | FLUORINE CONTENT (wt%) | PEAK WAVELENGTH (nm) | RELATIVE EMISSION INTENSITY (%) | CHROMATICITY | | PARTICLE SIZE (μm) | BET (m$^2$/g) |
|---|---|---|---|---|---|---|---|---|---|
| | | | | | | x | y | | |
| COMPARATIVE EXAMPLE 1 | Ca$_{0.985}$AlSiN$_3$:Eu$_{0.015}$ | 0.000 | <0.1 | 651.5 | 100.0 | 0.653 | 0.346 | 5.851 | 1.087 |
| EXAMPLE 5 | | 0.025 | 0.40 | 656.0 | 117.3 | 0.677 | 0.323 | 5.336 | 1.041 |
| EXAMPLE 6 | | 0.050 | 0.80 | 656.0 | 115.2 | 0.674 | 0.325 | 6.845 | 1.097 |
| EXAMPLE 7 | | 0.100 | 1.70 | 654.0 | 109.6 | 0.672 | 0.327 | 6.954 | 1.064 |

PHOSPHOR AND MANUFACTURING METHOD FOR THE SAME, AND LIGHT SOURCE

This is a Division of application Ser. No. 12/292,889, filed Nov. 28, 2008, issued as U.S. Pat. No. 7,476,338, on Sep. 28, 2010, which is a Division of application Ser. No. 11/211,751 filed Aug. 26, 2005, issued as U.S. Pat. No. 7,476,338, on Jan. 13, 2009, which claims priority to Japanese Patent Application Nos. 2004-248405 filed Aug. 27, 2004 and 2005-105126 filed Mar. 31, 2005. The entire disclosures of the prior applications are hereby incorporated by reference herein.

TECHNICAL FIELD

The present invention relates to a phosphor used in a display such as a cathode-ray tube (CRT), a field emission display (FED), and a plasma display (PDP), and an illumination device such as a fluorescent lamp and a fluorescent display tube, and a backing light source for liquid crystal display, and a method of manufacturing therefore, and also to the light source using the phosphor.

BACKGROUND ART

At present, a white LED illumination has been focused as the illumination of the next generation. Conventionally, a discharge type fluorescent lamp and an incandescent bulb used as an illumination device involve problems that a harmful substance such as mercury is contained, life span is short, and heat generation is violent. However, in recent years, a high luminance LED emitting light in a region of blue color and near ultraviolet/ultraviolet, which is required for the white LED illumination, has been developed sequentially. Also, study and development have been actively performed on using the white LED illumination as the illumination of the next generation.

At present, two systems of the white LED illumination are proposed. As one of them, a multi chip type system is given, in which three primary colors of high luminance red LED, a high luminance blue LED, a high luminance green LED, are used. As the other of them, one chip system, which has been developed in recent years, is given, in which LED such as a high luminance ultraviolet LED and a high luminance blue LED, and the phosphor excited by the light having an emission spectrum with a peak in the range from ultraviolet to blue color generated from the LED are combined.

When the aforementioned two systems are compared, the one chip type system has a preferable characteristic as the light source for illumination, such that since it is constituted by combining an LED and the phosphor, it can be small-sized, and the light guide for mixing the emission is simplified, and in addition, the drive voltage, the optical output, and the temperature characteristic of each LED are not required to be taken into consideration, thus realizing cost reduction. Further, by using the phosphor having a broad emission spectrum, the white emission spectrum is approximated the spectrum of the sun-light, and the color rendering properties are possibly improved. This contributes to focusing on the one chip type system as the illumination of the next generation, compared with the multi chip type system.

Further two systems are generally considered for the one chip-type white LED illumination in which the high luminance LED and the phosphor are combined. In one of them, the blue LED with high luminance and the phosphor emitting yellow color by being excited by blue light generated from the LED are combined, and white color is obtained by using a complementary relation between the blue emission of the LED and yellow emission of the phosphor. In the other of them, the LED emitting near ultraviolet/ultraviolet light, the phosphor emitting red (R) color, the phosphor emitting green (G) color, and the phosphor emitting blue (B) color by being excited by the near ultraviolet/ultraviolet light generated from the LED are combined, and the white light is obtained by mixing the colors of the lights obtained from the phosphors of R, G, B and other phosphor.

As the white LED illumination combining the high luminance blue LED and the phosphor emitting yellow color excited by the blue light generated from the LED, the white LED combining the high luminance blue LED and a yellow phosphor $(Y, Gd)_3(Al, Ga)_5O_{12}$:Ce (expressed as YAG:Ce) is proposed. Such a white LED has an advantage that by using the complementary relation between the blue light and the yellow light, the kind of the phosphor to be used may be reduced, compared to the system in which near ultraviolet/ultraviolet LED is used. Further, the yellow phosphor YAG:Ce to be used has an excitation spectrum with a peak near the wavelength of 460 nm of emission from the blue LED, thereby emitting light with high efficiency, and the white LED of high luminance can thereby be obtained.

In the latter one chip-type white LED, white color is obtained by mixing the colors of the emission from the phosphors such as R, G, B and so forth, by combining the LED emitting the near ultraviolet/ultraviolet light, the each phosphor emitting red (R), green (G), blue (B) colors excited by the near ultraviolet/ultraviolet light generated from the LED. A method of obtaining the white emission by mixing the emission such as the R, G, B is characterized in that an arbitrary emission color in addition to the white light can be obtained by controlling a combination and a mixing ratio of the R, G, B and also the white emission with excellent color rendering properties is obtained by the relation in a mixed state of colors not using the complementary relation but using the R, G, B. Then, as the phosphor used for such an application, examples are given such as $Y_2O_2S$:Eu, $La_2O_2S$:Eu, $3.5MgO.0.5MgF_2.GeO_2$:Mn, $(La, Mn, Sm)_2O_2S.Ga_2O_3$:$E_u$ for the red phosphor, ZnS:Cu,Al, $SrAl_2O_4$:Eu, BAM:Eu,Mn, $Ba_2SiO_4$:Eu for the green phosphor, and BAM:Eu, $Sr_5(PO_4)_3Cl$:Eu, ZnS:Ag, $(Sr, Ca, Ba, Mg)_{10}(PO_4)_6Cl_2$:Eu for the blue phosphor.

However, in the former white LED illumination formed by combining the high luminance blue LED and the yellow phosphor (YAG:Ce), the light emission in the longer wavelength side of a visible light region is insufficient, resulting in a bluish white light emission. Then, a red emission spectrum in the vicinity of the wavelength range from 600 nm to 700 nm is insufficient, thereby making it impossible to obtain a slightly reddish white light emission like a lamp bulb, to pose a problem of deteriorated color rendering properties. Further, in regards to an excitation range of the yellow phosphor YAG:Ce, although having an excitation band with highest efficiency in the vicinity of 460 nm wavelength, the yellow phosphor YAG:Ce does not have the excitation band with excellent efficiency in a broad range. Therefore, by the variation in emission wavelength due to the variation in the light emitting element during manufacturing the blue LED, the emission wavelength of the blue LED is deviated from an optimal excitation range of the YAG:Ce-based yellow phosphor, resulting in a situation of losing a wavelength balance of blue color and yellow color. When such a situation occurs, there is the problem that the color tone of the white light obtained by synthesizing the blue light and the yellow light is changed.

In addition, In the latter white LED illumination formed by combining the near ultraviolet/ultraviolet LED and phosphors of R, G, B and so forth, an excitation efficiency and an emission efficiency of the red phosphor and so forth is lower compared with the phosphor of other colors in an excitation range of the near ultraviolet/ultraviolet region. Therefore, the combination of the R, G, B and so forth has no other choice but increase the mixing ratio of only the red phosphor. This causes an insufficient mixing ratio of the phosphor such as the green phosphor improving the luminance, and the white color with high luminance can not be obtained. Further, the red phosphor according to the conventional technique has a sharp emission spectrum, thereby involving the problem that the color rendering properties of the white light obtained is unsatisfactory.

In order to solve the aforementioned problem, it is necessary to obtain the phosphor having the emission spectrum with a broad peak in the range from yellow color to red color (580 nm to 680 nm), and having an excellent excitation band in the longer wavelength side in the range from a near ultraviolet/ultraviolet as an excitation light to a visible light (250 nm to 550 nm). Recently, the phosphors are proposed such as an oxynitride glass phosphor capable of obtaining a broad emission peak in the range of yellow color to red color (for example, see patent document 1), a sialon-based phosphor (for example, see patent documents 2 and 3), and the phosphor containing nitrogen such as silicon nitride-based phosphor (for example, see patent documents 4 and 5), The phosphor containing nitrogen as described above has a larger ratio of convalent bonds, compared with the oxide-based phosphor, and therefore has an excellent excitation band even in the light of 400 nm or more wavelength. Therefore, the phosphor containing the nitrogen is focused as a phosphor for a white LED illumination.

The inventors of the present invention also propose the phosphor having the emission spectrum with an excellent excitation band in the wavelength range from the near ultraviolet/ultraviolet to visible light (250 nm to 550 nm) and a broad peak in the range from yellow color to red color (580 nm to 680 nm), and containing nitrogen (Japanese Patent Application No. 2004-55536).

(Patent document 1) Japanese Patent Laid Open No. 2001-214162
(Patent document 2) Japanese Patent Laid Open No. 2003-336059
(Patent document 3) Japanese Patent Laid Open No. 2003-124527
(Patent document 4) Japanese Patent Laid Open No. 2003-515655
(Patent document 5) Japanese Patent Laid Open No. 2003-277746

However, although the phosphor proposed by the inventors of the present invention is improved in the point of having the emission spectrum with a broad peak in the range from yellow color to red color (580 nm to 680 nm) and an excellent excitation band in the longer wavelength side in the range from a near ultraviolet/ultraviolet as an excitation light to a visible light (250 nm to 550 nm), the problem is involved therein such that the emission intensity is not a satisfactory level. Therefore, even when the white LED illumination is manufactured by combining the near ultraviolet/ultraviolet LED and the blue LED, the mixing ratio of only red phosphor must be increased, thereby making the green phosphor or the like insufficient to improve the luminance, and in some cases, a high luminance white color can not be obtained.

Therefore, the inventors of the present invention prepare samples of various phosphors, while pursuing the cause of not obtaining a sufficient emission intensity in the phosphor, and come to an understanding that a melting point of the raw material to be used is high, thereby making it difficult to progress a solid reaction, resulting in a non-uniform reaction.

SUMMARY OF THE INVENTION

In view of the above-described problem, the present invention is provided, and an object of the present invention is to provide a phosphor having an emission spectrum with a broad peak in a range from yellow color to red color (580 nm to 680 nm) and an excellent excitation band in a longer wavelength side, and improved in an emission intensity.

One of other object of the present invention is to provide a manufacturing method of the phosphor having the emission spectrum with a broad peak in the range from yellow color to red color (580 nm to 680 nm) and the excellent excitation band in the longer wavelength side in the range from a near ultraviolet/ultraviolet as an excitation light to a visible light (250 nm to 550 nm), and capable of improving the emission intensity.

The other object of the present invention is to provide a light source using the phosphor having the emission spectrum with a broad peak in the range from yellow color to red color (580 nm to 680 nm) and the excellent excitation band in the longer wavelength side in the range from a near ultraviolet/ultraviolet as an excitation light to a visible light (250 nm to 550 nm), and capable of improving the emission intensity.

The inventors of the present invention further study on the phosphor to accelerate a progress of the solid reaction and realize a uniform reaction, and come to the understanding that boron and/or fluorine must be contained in the phosphor, and further come to the understanding that the content of an element Fe in the phosphor must be decreased.

Therefore the present invention takes several aspects as follows.

In a first aspect, a phosphor is provided, which is given by a general composition formula expressed by $M_mA_aD_dO_oN_n:Z$, (wherein element M is at least one kind of element having bivalent valency, element A is at least one kind of element having tervalent valency selected from the group consisting of Al, Ga, In, Tl, Y, Sc, P, As, Sb, and Bi, element D is at least one kind of element having tetravalent valency, O is oxygen, N is nitrogen, and element Z is at least one kind of element selected from rare earth elements or transitional metal elements, satisfying $m>0$, $a>0$, $b>0$, $o \geq 0$, and $n=2/3 m+a+4/3b-2/3o$), and further containing boron and/or fluorine.

In a second aspect, the phosphor according to the first aspect is provided, wherein a content of the boron is not less than 0.001 wt %, and not more than 3.0 wt %.

In a third aspect, the phosphor according to either of the first or second aspect is provided, wherein the content of the fluorine is not less than 0.1 wt %, and not more than 3.0 wt %.

In a fourth aspect, the phosphor according to any one of the first aspect to third aspect is provided, wherein the values of the m, a, b are set so as to satisfy $m=a=b=1$, and $o=0$.

In a fifth aspect, the phosphor according to any one of the first to fourth aspects is provided, wherein the element M is at least one kind of element selected from the group consisting of Mg, Ca, Sr, Ba, and Zn, the element A is at least one kind of element selected from the group consisting of Al and Ga, the element D is Si and/or Ge, and the element Z is at least one kind of element selected from the rare earth elements and the transitional metal elements.

In a sixth aspect, the phosphor according to any one of the first to fifth aspects is provided, wherein the element M is Ca, the element A is Al, the element D is Si, and the element Z is Eu.

In a seventh aspect, the phosphor according to any one of the first to sixth aspects is provided, wherein the content of the element Fe is smaller than 200 ppm.

In an eighth aspect, the phosphor according to any one of the first to seventh aspect is provided, wherein the phosphor is in a powdery state.

In a ninth aspect, the phosphor according to the eighth aspect is provided, wherein an average particle size of the phosphor is not more than 20 μm and not less than 0.1 μm.

In a tenth aspect, the phosphor according to the eighth aspect is provided, wherein a specific surface area of the phosphor powder is not more than 50 m$^2$/g and not less than 0.1 m$^2$/g.

In an eleventh aspect, a manufacturing method of the phosphor having the structure according to any one of the first to tenth aspects is provided, comprising:

weighing and mixing a compound containing the element M, the compound containing the element A, and the compound containing the element Z or a simple substance of the element Z, and a boron compound and/or a fluorine compound, to obtain a mixture;

firing the mixture, to obtain a fired object; and pulverizing the fired object, to obtain the phosphor.

In a twelfth aspect, the manufacturing method of the phosphor according to the eleventh aspect is provided, wherein the compound containing the element M, the compound containing the element A, the compound containing the element D, and the compound containing the element Z or a simple substance of the element Z, and to the boron compound containing 100 ppm or less content of Fe and/or fluorine compound containing 100 ppm or less content of Fe are used.

In a thirteenth aspect, the manufacturing method of the phosphor according to the twelfth aspect is provided, wherein as a compound containing the element M, the nitride of the Group II expressed by the general formula $M_3N_2$ containing 100 ppm or less of element Fe (wherein the element M is at least one kind of element selected from the group consisting of Mg, Ca, Sr, Ba, and Zn.) is used.

In a fourteenth aspect, the manufacturing method of the phosphor according to the thirteenth aspect is provided, wherein the nitride of the Group II element manufactured by nitriding a simple substance of 2N or more containing 100 ppm or less Fe is used, in a nitrogen atmosphere or in an ammonia atmosphere at the temperature of 300° C. or more.

In a fifteenth aspect, the manufacturing method of the phosphor according to any one of the eleventh to fourteenth aspects is provided, wherein AlN having an average particle size of 0.1 μm to 5.0 μm is used as the compound containing the element A, and $Si_3N_4$ having the average particle size of 0.1 μm to 5.0 μm is used as the compound containing the element D.

In a sixteenth aspect, the manufacturing method of the phosphor according to any one of the eleventh to fifteenth aspects is provided, wherein the boron compound is BN and/or $H_3BO_3$.

In a seventeenth aspect, the manufacturing method of the phosphor according to any one of the eleventh to fifteenth aspects is provided, wherein the fluorine compound is $CaF_2$ and/or $AlF_3$.

In an eighteenth aspect, the manufacturing method of the phosphor according to any one of the eleventh to seventeenth aspects is provided, wherein any one of the nitrogen atmosphere, the ammonia atmosphere, a mixed gas atmosphere of nitrogen and hydrogen, and the mixed gas atmosphere of nitrogen and ammonia is used, in the step of obtaining a fired object by firing the mixture.

In a nineteenth aspect, the manufacturing method of the phosphor according to any one of the eleventh to seventeenth aspects is provided, wherein a nitrogen gas of 80% or more concentration is used, as an atmosphere gas during firing, in the step of obtaining the fired object by firing the mixture.

In a twentieth aspect, the manufacturing method of the phosphor according to any one of the eleventh to nineteenth aspects is provided, wherein the mixture is fired while ventilating the atmosphere gas at the rate of 0.01 L/min or more, in the step of obtaining the fired object by firing the mixture.

In a twenty-first aspect, the manufacturing method of the phosphor according to any one of the eleventh to twentieth aspect is provided, wherein the temperature is set at not less than 1200° C. and not more than 1600° C. during firing, in the step of obtaining the fired object by firing the mixture.

In a twenty-second aspect, the manufacturing method of the phosphor according to any one of the eleventh to twenty-first aspect is provided, wherein a pressurizing state of the atmosphere gas during firing is set at not less than 0.001 MPa and not more than 0.1 MPa.

In the twenty-third aspect, a light source is provided, comprising the phosphor according to any one of the first to tenth aspects, and a light emitting part.

In a twenty-fourth aspect, the light source according to the twenty-third aspect is provided, wherein a wavelength range of light emitted from the light emitting part is 250 nm to 550 nm.

In a twenty-fifth aspect, the light source according to either of the twenty-third aspect or the twenty-fourth aspect is provided, wherein an LED (light emitting diode) is used as the light emitting part.

According to the phosphor of any one of the first to tenth aspects, the phosphor expressed by the composition formula MmAaDdOoNn:Z (wherein the element M is at least one kind of element having bivalent valency, the element A is at least one kind of element having tervalent valency selected from the group consisting of Al, Ga, In, Tl, Y, Sc, P, As, Sb, and Bi, the element D is at least one kind of element having tetravalent valency, O is oxygen, N is nitrogen, and the element Z is at least one kind of element selected from the rare earth elements or the transitional elements, further satisfying m>0, a>0, b>0, n2/3 m+a+4/3b−2/3o) has excellent emission characteristics that a peak wavelength of the light emission is in the range from 580 nm to 680 nm and the emission spectrum has a half value width of 50 nm or more, and further has excitation band characteristics of having the emission spectrum with a flat and high efficient excitation band in a broad wavelength range from the ultraviolet to the visible light (wavelength range from 250 nm to 550 nm).

In addition, since the phosphor contains the boron and/or fluorine, a producing temperature of a liquid phase generated during firing is decreased, and the solid reaction is uniformly progressed. Therefore, the emission intensity of the phosphor can be improved.

Further, when the phosphor contains not less than 0.001 wt % and not more than 3.0 wt % of boron, and contains not less than 0.1 wt % and not more than 3.0 wt % of fluorine, the producing temperature of the liquid phase generated during firing is decreased, and the solid reaction is more uniformly progressed, and in addition, a violent sintering can be suppressed. Therefore, the emission efficiency of the phosphor can be further improved.

The phosphor according to any one of the eighth aspect to tenth aspect is in a powdery state, and therefore coating and filling of the phosphor can be easily performed. Further, since the average particle size of the phosphor powder is not more than 20 µm and not less than 0.1 µm, and the specific surface area is not more than 50 m$^2$/g and not less than 0.1 m$^2$/g, the emission efficiency can be improved.

According to the manufacturing method of the phosphor of any one of the eleventh to twenty-second aspects, by adding the boron compound such as BN and H$_3$BO$_3$ as an additive agent other than the raw material of the phosphor, the producing temperature of the liquid phase generated in the process of the solid phase reaction is decreased, and the phosphor having an improved emission efficiency can be manufactured.

Also, by adding the fluorine compound such as CaF$_2$ and AlF$_3$ as the additive agent other than the raw material of the phosphor, the producing temperature of the liquid phase generated in the process of the solid phase reaction can be decreased, and the phosphor having the improved efficiency can be manufactured.

According to the manufacturing method of the phosphor of the fifteenth aspect, by using AlN and Si$_3$N$_4$ with average particle size (D50) from 0.1 µm to 10.0 µm, the phosphor with particle size suitable for coating and filling, and further suitable for improving the emission intensity can be manufactured.

According to the manufacturing method of the phosphor of the twentieth aspect, the phosphor capable of suppressing adsorption of the oxygen during firing and decreasing the oxygen concentration of the phosphor and having suitable particle size for improving the emission intensity can be manufactured.

The light source according to anyone of the twenty-third to twenty-fifth aspects emits light, having the excitation band in a predetermined broad wavelength range (250 nm to 550 nm) of the light emitted from the light emitting part (corresponding to LED according to the twenty-fifth aspect). Therefore, by combining the aforementioned phosphors and the light emitting part, the light source with high emission efficiency emitting the visible light or the white light can be obtained.

BRIEF DESCRIPTION OF THE DRAWINGS

FIG. 1 is a diagram showing a boron content and emission characteristics or the like in Ca$_{0.985}$AlSiN$_3$:Eu$_{0.015}$, which is an example of a phosphor according to the present invention.

FIG. 3 is a diagram showing a fluorine content and the emission characteristics or the like in Ca$_{0.985}$AlSiN$_3$:Eu$_{0.015}$, which is an example of a phosphor according to the present invention.

DESCRIPTION OF THE PREFERRED EMBODIMENT

Figure 2:
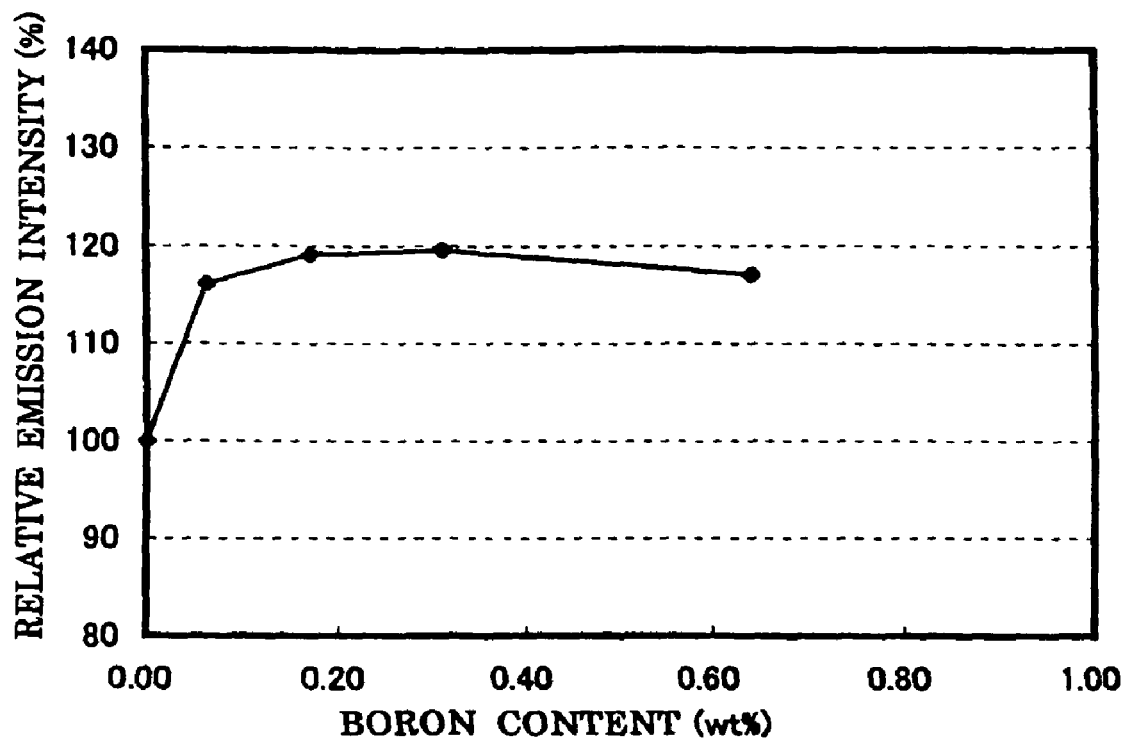
FIG. 2 is a graph showing the relation between the boron content and a relative emission intensity in the phosphor of FIG. 1.

Hereafter, preferred embodiments of the present invention will be explained.

The preferred embodiments of the present invention provide a phosphor having an emission spectrum with a broad peak of 50 nm or more half value width in a range from yellow color to red color (580 nm to 680 nm) and a flat and highly efficient excitation band, which is the range from the near ultraviolet/ultraviolet as an excitation light to visible light (250 nm to 550 nm) on the longer wavelength side, and further capable of obtaining an excellent emission intensity by containing boron and/or fluorine in the phosphor, and a manufacturing method therefore.

In the phosphor having not less than 0.001 wt % and not more than 3.0 wt % of boron content, excellent emission characteristics can be obtained. The boron content is more preferably in the range from 0.05 wt % to 2.0 wt %, and further preferably in the range from 0.15 wt % to 0.35 wt %. Although a detailed reason is not clarified, generally nitride has a high melting point, and hardly generates a liquid phase during solid reaction. Therefore, in many cases, the reaction does not progress smoothly. However, in the phosphor containing the boron, the producing temperature of the liquid phase is decreased and the liquid phase is easily generated, thereby accelerating the reaction, further making the solid reaction uniformly progress, and the phosphor having the excellent emission characteristic can be obtained.

When the boron content is not more than 3.0 wt %, sintering does not become violent, thereby not reducing the emission characteristic in a pulverizing process. Further, when not more than 3.0 wt % of boron is contained, a matrix structure exhibiting an excellent emission intensity can be maintained, and this is considered to be preferable. Also, when the boron content is not less than 0.001 wt %, the liquid phase is sufficiently produced, and a desired effect can be obtained.

Also, in the phosphor having the fluorine content of not less than 0.1 wt % and not more than 3.0 wt %, the excellent emission intensity can be obtained. More preferably, the fluorine content is in the range from 0.01 wt % to 2.0 wt %. Detailed reasons are not clarified. However, the cause is also considered as follows. A lot of nitrides have generally high melting points, thereby hardly generating the liquid phase during the solid reaction, preventing the reaction from progressing. Meanwhile, in the fluorine content, in the same way as the case of the boron content, the producing temperature of the liquid phase is decreased, thereby easily generating the liquid phase, accelerating the reaction, and further making the solid reaction uniformly progress, and the phosphor having the excellent emission characteristic can be obtained.

When the fluorine content is not more than 3.0 wt %, the sintering does not become violent and the emission characteristic is not reduced in the pulverizing process. Therefore, the desired effect can be obtained. Further, when the fluorine content is not more than 3.0 wt %, an impurity phase not contributing to the light emission is not generated, thereby not inviting a reduction in the emission characteristic, and this is considered to be preferable. Also, when the fluorine content is not less than 0.1 wt %, the liquid phase is sufficiently generated, and the desired effect can be obtained.

In the phosphor of this example, it is satisfactory to have cases such as not only the case in which the boron and the fluorine are singly contained respectively, but also the case in which not less than 0.001 wt % and not more than 3.0 wt % of boron, and not less than 0.1 wt % and not more than 3.0 wt % of fluorine are contained.

Also, the phosphor according to this example is expressed by the composition formula MmAaDdOoNn:Z. Here, the element M is at least one kind of element having bivalent valency, the element A is at least one kind of element having tervalent valency selected from the group consisting of Al, Ga, In, Tl, Y, Sc, P, As, Sb, and Bi, the element D is at least one kind of element having tetravalent valency, O is oxygen, N is nitrogen, and element Z is at least one kind of element selected from rare earth elements or transitional metal elements.

Further, when the phosphor of the composition formula MmAaDdOoNn:Z has a chemically stable composition, the impurity phase not contributing to the light emission is hardly generated in the phosphor, thus suppressing the deterioration in the emission characteristic to realize a preferable structure. Therefore, in order to obtain a chemically stable composition of the phosphor, preferably the phosphor satisfies the relation expressed by $m>0$, $a>0$, $b>0$, $o \geq 0$, $n-2/3\ m+a+4/3b-2/3o$, and further preferably the relation of m, a, and b satisfies $m/(a+b) \leq 1/2$, in the aforementioned composition formula MmAaDdOoNn:Z.

Further, in the phosphor having the composition of the aforementioned composition formula MmAaDdOoNn:Z, the element M is the element having + bivalent valency, the element A is the element having + tervalent valency, the element D the element having + tetravalent valency, oxygen is the element having − bivalent valency, and nitrogen is the element having − tervalent valency. Therefore, when m, a, b, and n satisfy the composition expressed by $n=2/3\ m+a+4/3b-2/3o$, the valency of each element is added to be zero, thus preferably realizing a further stable compound in the composition of the phosphor. Particularly, when the relation of m, a, b, and n satisfies $m:a:b:n=1:1:1:3$ (and $o=0$), the phosphor having excellent emission characteristic and excitation band characteristic is obtained.

In any case, a slight deviation of the composition from the aforementioned composition formula showing the composition of the phosphor of the present invention is allowable. For example, the phosphor prepared satisfying $m:a:b:n=1:1:1:3$ does not basically contain oxygen. However, the aforementioned phosphor sometimes contains the oxygen. The oxygen in this case is considered to be the oxygen initially contained in the raw material and the oxygen adhered to the surface of the raw material, and the oxygen mixed in resulting from the oxidization of the surface of the raw material during mixing and firing the raw materials, and the oxygen adsorbed on the surface of the phosphor after firing. As a result, in some cases, the oxygen of 3.0 wt % or less is contained with respect to the mass of the phosphor. However, preferably the oxygen content of the phosphor has an upper limit set at the aforementioned 3.0 wt %, thereby being set at not more than this upper limit value.

Preferably, the element M is at least at least one kind of element selected from the group consisting of Be, Mg, Ca, Sr, Ba, Zn, Cd, and Hg, further preferably is at least one kind of element selected from the group consisting of Mg, Ca, Sr, Ba, and Zn, and most preferably is Ca.

Preferably the element A is at least at least one kind of element having tervalent valency selected from the group consisting of Al, Ga, In, Tl, Y, Sc, P, As, Sb, and Bi, further preferably is at least one kind of element selected from Al and Ga, and most preferably is Al. Out of these elements, Al is easily available at a low cost, with small environmental load, and preferable. Particularly, AlN, which is a nitride, is used as a thermoelectric material and a structural material generally used.

Preferably, the element D is at least one kind of element having tetravalent valency selected from the group consisting of C, Si, Ge, Sn, Ti, Hf, Mo, W, Cr, Pb, and Zr, further preferably is Si and/or Ge, and most preferably is Si. Out of these elements, Si is easily available at a low cost, with small environmental load, and preferable. Particularly, $Si_3N_4$, which is a nitride, is used as the thermoelectric material and the structural material generally used.

Preferably, the element Z is at least one kind of element selected from the rare earth elements and the transitional metal elements. However, in order to exhibit an excellent color rendering property in an illumination device and a light emitting device using the phosphor, preferably the light emission of the phosphor has the emission spectrum with a broad half value width. Then, from this viewpoint, the element Z is preferably at least at least one kind of element selected from the group consisting of Eu, Mn, Sm, and Ce. Out of these elements, when Eu is used as the element Z, the phosphor exhibits a high emission efficiency in the range from orange color to red color, and the spectrum with a broad half value width of 50 nm or more can be obtained. Therefore, Eu is more preferable as the activator of the phosphor used in the illumination device and the light emitting device.

Incidentally, in accordance with the kind of the element Z substituting a part of the element M of the composition of the phosphor, the phosphor having the light emission with different wavelength can be obtained.

When the phosphor is expressed by MmAaDdOoNn:Z, preferably the amount of the element Z to be added is in such a range as satisfying the molar ratio of the element M to the element Z, $z/(m+z)$, being in the range from 0.0001 to 0.5. When the molar ratio $z/(m+z)$ of the element M and the activator Z is within the aforementioned range, the deterioration in the emission efficiency resulting from the concentration quenching due to an excessive content of the activator can be avoided, and meanwhile, the deterioration in the emission efficiency resulting from insufficient emission contributing atoms due to too little content of the activator can also be avoided. In addition, more preferably the value of the aforementioned $z/(m+z)$ is in the range from 0.005 to 0.1. However, an optimal value of the aforementioned $z/(m+z)$ is slightly fluctuated by the kind of the activator Z and the kind of the element M. Further, by controlling the amount of the activator Z to be added also, the peak wavelength of the emission spectrum of the phosphor can be set by shifting, which is useful for adjusting the luminance.

When the phosphor of this example is used in the form of a powder, it is preferable to set the average particle size (D50) of the phosphor powder at not more than 20 µm. This is because by setting the average particle size (the average particle size in this invention refers to a median diameter (D50).) at not more than 20 µm, and further preferably set at not less than 3 µm and not more than 15 µm, the surface area per unit weight of the powder can be secured, and the deterioration in the luminance can be avoided, because the light emission in the phosphor powder is considered to occur on the surface of the particle. Further, the powder is formed into paste, and when the paste thus formed is applied to the light emitting element or the like also, the density of the powder can be heightened, and from this viewpoint also, the deterioration in the luminance can be avoided. In addition, according to the study of the inventors of the present invention, although a detailed reason is not clarified, it was found that preferably the average particle size was larger than 0.1 µm from the viewpoint of the emission efficiency of the phosphor powder. As described above, the average particle size of the phosphor powder in this example is preferably set at not less than 0.1 µm and not more than 20 µm.

When the phosphor of this example is manufactured, as the raw materials of the element M (+ bivalent valency), the element A (+ tervalent valency), and the element D (+ tetravalent valency), the nitride and oxide of each of them and the compound of any one of them may be used. For example, the nitride ($M_3N_2$) and the oxide (MO) of the element M, and the nitride (AN, $D_3N_4$) of the element A and the element D may be used and mixed. Then, by controlling the blending ratio of both of the nitride and the oxide, an amount of oxygen and an amount of nitrogen in the phosphor can be controlled, without changing the value of m. Of course, the nitride and the oxide are not limited to the compound obtained by combining with only oxygen and the compound obtained by combining with only nitrogen, but for example, refers to the compound having the oxygen and the element, such as carbonate acid salt and oxalic acid salt, which are decomposed to become substantially oxide during firing, and the nitride also refers to the compound having the element and the nitrogen.

However, for convenience of explanation hereunder, as the compound having the aforementioned element and the oxygen, and as the compound having the aforementioned element and the nitrogen, by way of example, the oxide of the aforementioned element and the nitride of the aforementioned element will be explained, respectively.

For example, when the raw materials are measured under the condition of o=0, m=a=b=1, each raw material may be weighed at the molar ratio of $M_3N_2$:AN:$D_3N_4$=1:3:1. Further, in this condition, when the element Z is the element having bivalent valency, the element Z substitute a part of the element M. Therefore, in consideration of this substitution, preferably the phosphor is expressed by MmAaDbNn:Zz, satisfying (m+z)=a=b=1. The chemically stable composition of the phosphor is thereby obtained.

Further, in this example, it was found that the emission characteristic was improved by adding a boron compound and a fluorine compound as additive agents. In this case, the boron compound, such as BN, $H_3BO_3$, $B_2O_6$, $B_2O_3$, and $BCl_3$, may be added to obtain not more than 3.0 wt % of the boron in the sample after firing, and out of these elements, BN and $H_3BO_3$ are preferable. Such boron compounds may be mixed for use. The boron compound has high thermal conductivity. Therefore, by adding the boron compound to the raw material, a uniform temperature distribution of the raw material during firing is obtained, and it is estimated that the emission characteristic is improved to accelerate the solid phase reaction. The boron compound can be added to the raw material in such a manner that it is added together with the raw materials during mixing so as to be mixed therein.

Also, preferably the fluorine compound, such as $CaF_2$, $AlF_3$, $EuF_2$, $EuF_3$ is added to obtain not more than 3.0 wt % of fluorine in the sample after firing. Such fluorine compounds have low melting points compared to those of raw materials, AlN and $Si_3N_4$, thereby easily generating a liquid phase. Therefore, by covering the surface of the surface of the particle of the raw material, it appears that diffusion of atoms can be accelerated, and the emission characteristic is thereby improved. Moreover, the fluorine compound obtained by combining the fluorine and calcium, the fluorine and aluminum, and the fluorine and europium is preferably added to the phosphor in which the element M is Ca, the element A is Al, the element D is Si, and the element Z is Eu, because the same element is contained therein as the element having the aforementioned composition formula. Such fluorine compounds may also be mixed for use.

Amounts of the boron and the fluorine to be added to such raw materials, and contents of the boron and fluorine after firing are not always matched. This is because some of the boron and the fluorine is flown during firing, and therefore the content thereof becomes smaller than that at the time of addition of the raw materials, or a slight amount of boron and fluorine is contained in each raw material also, and therefore the content thereof becomes larger than that at the time of adding the raw materials. Note that for convenience of explanation, the oxygen in the composition formula is omitted in the explanation given hereunder.

Next, the manufacturing method of the phosphor in this example will be explained, with manufacture of $Ca_{0.985}AlSiN_3$:$Eu_{0.0150}$ given as an example.

Each nitride raw material of the element M, the element A, and the element D may be a commercially available raw material. However, higher purity is more preferable, and therefore preferably the nitride raw material of 2N or more, and more preferably 3N or more is prepared. Further, it becomes possible to prepare the phosphor with excellent emission efficiency, by using the raw material having not more than 100 ppm of element Fe contained therein, as the nitride raw material of each element.

Here, explanation will be given to a case where the nitride raw material having the element Fe of not more than 100 ppm is used.

The nitride of the element M, such as conventionally available $Ca_3N_2$ contains the element Fe of about 250 ppm.

Therefore, preferably the nitride raw material of the element M of the phosphor according to the present invention is used, which is manufactured by the following method, for example.

First, a simple substance of the element M of 2N or more and having the content of the element Fe of 100 ppm or less is prepared. Some of simple substances of the alkali-earth metal have oil films on the surface which are stuck during storage. Therefore, the surface of the simple substance of alkali-earth metal is washed with organic solvent in an inert gas atmosphere. The metal body thus washed is heated and nitrided at the temperature of 300° C. or more in the atmosphere of nitrogen or ammonia, to thereby manufacture the nitride. Preferably, a vessel or a crucible used at the time of nitriding is the vessel having a small content of the element Fe, and specifically a BN crucible with high purity is preferable. Also, preferably a heating temperature for nitriding is not less than 700° C., because the nitriding is accelerated by a higher temperature. The nitride of the element M thus obtained may be pulverized to not more than 100 μm degree of particle for use.

The nitride of the element A and the nitride of the element D are also obtained by nitriding the metal element in the same method. However, in regards to the nitride of the element A, such as AlN, even the conventionally available one has the content of the element Fe of about 10 ppm or less, and therefore such a nitride of the element A may be used.

Also, in regards to the nitride of the element D, such as $Si_3N_4$, the conventionally available one has the content of the element Fe of about 50 ppm or less, and therefore such a nitride of the element D may also be used.

Next, the particle size and shape of each nitride raw material will be explained.

It is preferable to prepare the nitride raw material having the particle size and shape approximated the particle size and shape desired for the phosphor finally obtained. As described above, the average particle size desired for the phosphor is preferably from 0.1 μm to 20.0 μm, and more preferably from 3.0 μm to 15.0 μm. Therefore, from the viewpoint of controlling the particle size of the phosphor powder after firing, it is preferable to set the average particle size of each raw material at 0.1 μm to 5.0 μm. Here, although it is preferable to set the average particle size of all the raw materials at 0.1 μm to 5.0 μm, the phosphor having the excellent emission characteristic can be manufactured by using at least AlN and $Si_3N_4$ having the aforementioned particle size, because AlN and $Si_3N_4$ mainly form the matrix structure and have high melting temperature. When the raw material has the average particle size of not less than 0.1 μm, such a raw material is hardly sintered and the emission intensity is not decreased in a pulverizing process after firing. In addition, a uniform reaction is obtained, in case of the raw material of not more than 20.0 μm, and this is preferable. Similarly, average sizes of the raw material of the element Z as will be describe hereunder and the raw material of an additive are also preferably set at 0.1 μm to 20.0 μm, and more preferably set at 1.0 μm to 5.0 μm.

The raw material of the element Z may also be the conventionally available nitride raw material or the oxide raw material. In this case also, the higher purity is preferable, and therefore the raw material of the element Z is preferably set at not less than 2N, and more preferably set at not less than 3N, and the raw material thus set is prepared. Note that the oxygen contained in the oxide raw material is also supplied to the composition of the phosphor, and therefore it is preferable to consider the oxygen supply amount when examining the blending ratio of the raw materials such as the aforementioned element M, element A, and element D. Then, when the oxygen is desired to be contained in the composition of the phosphors as less as possible, a simple substance of the element Z or the nitride of the element Z may be used as the raw material.

The raw material of the additive may also be the conventionally available boron compound or the fluorine compound. In this case also, the higher purity is preferable, and therefore the raw material of the additive is also preferably set at not less than 2N, and more preferably set at not less than 3N, and the raw material thus set is prepared.

In the manufacture of $Ca_{0.985}AlSiN_3:Eu_{0.0150}$, for example, as the nitride of the element M, the element A, and the element D, $Ca_3N_2$(2N), AlN(3N), and $Si_3N_4$(3N) may be prepared, respectively. As the element Z, $Eu_2O_3$(3N) is prepared and as the additive, the boron compound and/or fluorine compound are prepared.

These raw materials are weighed to obtain the mixing ratio of 0.985/3 mol of $Ca_3N_2$, 1 mol of AlN, 1/3 mol of $Si_3N_4$, and 0.015/2 mol of $Eu_2O_3$, so that the molar ratio of each element is expressed by Ca:Al:Si:Eu=0.985:1:1:0.015. Further, an arbitrary amount of the additive is also weighed and mixed.

In order to prevent the oxidization of the nitride, i.e. the raw material, it is convenient to perform the weighing and mixing in a glove box under the inert atmosphere. Moreover, the nitride raw material of each element is liable to be affected by oxygen and moisture. Therefore, preferably the inert gas from which the oxygen and the moisture are sufficiently removed is used. When the nitride raw material is used, a dry type mixing is preferable as a mixing system to obviate a decomposition of the raw material, and a usual dry type mixing system using a ball mill and a mortar may be selected. Note that when the organic solvent capable of preventing the decomposition of the raw material is used, a wet type mixing is also selected. Further, from the viewpoint of reducing the content of the element Fe, it is also preferable to use the solvent not containing the element Fe as the solvent containing the aforementioned organic solvent, in order to prevent mix-in of the element Fe during mixing.

The raw material thus mixed is put in a crucible, retained in any one of the gas atmosphere such as inert atmosphere of nitrogen or the like, ammonia atmosphere, mixed gas atmosphere of nitrogen and hydrogen, and mixed gas atmosphere of nitrogen and ammonia at 1000° C. or more, preferably at 1200° C. or more and 1600° C. or less, further preferably at 1400° C. or more and 1600° C. or less, for more than 30 minutes and preferably for 3 hours or more, and fired, with the inside of the furnace pressurized. The higher the firing temperature is, the more rapidly the reaction is progressed, and the retaining time is therefore shortened. Meanwhile, even when the firing temperature is low, the target emission characteristic can be obtained by maintaining the temperature for a long time. However, the longer the firing time is or the higher the firing temperature is, the more rapidly a particle growth is advanced, and the particle size becomes therefore large. Therefore, the firing time and the temperature may be set in accordance with the target particle size.

In the manufacture of the nitride phosphor, it is preferable to take a method of preventing the mix-in of the oxygen over the entire processes. First, the oxygen in the raw material and the oxygen stuck to the crucible or the like are taken into consideration as a factor of the mix-in of the oxygen. Therefore, the oxygen thus mixed-in needs to be reduced. However, it is hardly possible to remove all the oxygen. Therefore, by selecting the high temperature reductive gas atmosphere as the gas atmosphere for firing the raw material, the oxygen accompanying the decomposition and nitriding of the raw material can be removed. After studying on the reducing method of the remaining amount of the oxygen in the phosphor after firing, the inventors of the present invention found that during firing, there was a possibility that the oxygen stuck to the raw material such as $Eu_2O_3$ is released from the outside of a raw material crystal and combined with the crystal phase of the phosphor, and came to the system of ventilating the atmosphere gas during firing, to prevent the oxygen from combining to the crystal phase of the phosphor. Then, the result is obtained, such that less amount of oxygen is mixed-in in the phosphor manufactured by ventilating the atmosphere gas compared with the phosphor manufactured without ventilating the atmosphere gas, and the emission characteristic of the phosphor could be improved. Then, it is effective to continuously ventilate the gas atmosphere after initial period of firing, at a ventilation amount of 0.01 ml/min or more. However, more preferably the gas ventilation amount is 0.1 ml/min or more, and most preferably 1.0 L/min or more.

In the same way as the aforementioned atmosphere gas, the gas for ventilation may be any one of the inert gas such as nitrogen, the ammonia gas, the mixed gas of the nitrogen and the hydrogen, and the mixed gas of the nitrogen and the ammonia. However, an oxidization reaction of the phosphor occurs, when the oxygen is contained therein, and therefore preferably the oxygen or the moisture mixed-in as an impurity is 100 ppm or less. In addition, when the mixed gas of the nitrogen and other gas is used from the viewpoint of smoothly accelerating a nitriding reaction of the phosphor, it is preferable to set the concentration of nitrogen in the mixed gas at 80% or more.

The pressure in the furnace is preferably set in a pressurized state, after preventing the oxygen in the atmospheric air from mixing-in the furnace, and when the pressure in the furnace is set at 0.5 MPa (5.0 kgf/cm$^2$) or less, the phosphor having a sufficiently satisfactory characteristic can be obtained.

From the viewpoint of requiring a special pressure resistance in terms of designing a furnace facility when the pressure exceeds 0.1 MPa (1.0 kgf/cm$^2$), and from the viewpoint of suppressing an excessive acceleration of firing that occurs between phosphor powders and facilitating the pulverizing after firing, the pressure is preferably set at 0.001 MPa (0.01 kgf/cm$^2$) or more and 0.1 Mpa (1 kgf/cm$^2$) or less, and further preferably set at 0.001 Mpa (0.01 kgf/cm$^2$) or more and 0.05 Mpa (0.5 kgf/cm$^2$) or less.

As the crucible, an $Al_2O_3$ crucible, $Si_3N_4$ crucible, an AlN crucible, a sialon crucible, a C (carbon) crucible, and a BN (nitride boron) crucible, not containing impurities such as the element Fe and posing no problem even in the inert gas atmosphere can be used. However, it is preferable to use the BN crucible, because the mix-in of the impurities from the crucible can be prevented. Further, when the BN crucible is used, B is mixed-in from a part where the BN crucible and the raw material are brought into contact with each other, even if not adding a BN powder. In this condition, the emission characteristic of the phosphor can be improved. However, mix-in of B occurs at one of the part where the BN and the crucible are brought into contact with each other. Therefore, there is less improvement, when compared to the case where raw material powder and BN powder are mixed and B is mixed-in the whole area. Namely, by using the BN crucible, B may be mixed-in. However more preferably the BN powder and the raw material powder are mixed and B is mixed-in the whole area.

After firing is completed, a fired object is taken out from the crucible, and pulverized up to a predetermined average particle size, to thereby obtain the phosphor expressed by the composition formula $Ca_{0.985}AlSiN_3:Eu_{0.0150}$.

When other element is used as the element M, the element A, the element D, and the element Z, and when the amount of Eu as the activator is changed also, the phosphor having the predetermined composition formula can be manufactured by the same manufacturing method as that described above, by adjusting the blending amount at the time of mixing each raw material to a predetermined composition ratio.

As described above, the phosphor according to this embodiment the emission spectrum with an excellent excitation band in a broad range from the ultraviolet to visible light (wavelength range from 250 nm to 550 nm), and by this phosphor, the light source of high output and further an illumination unit including this light source can be obtained by combining the phosphor of this example and the light emitting part emitting the aforementioned ultraviolet to visible light (LED light emitting element as will be described later and a discharge lamp), because the emission intensity of the phosphor is high.

Namely, by combining the phosphor of this embodiment set in a powdery state with the light emitting part (particularly the light emitting part emitting the light having the wavelength range from 250 nm to 550 nm) by the publicly-known method, various display devices and illumination units can be manufactured. For example, by combining the phosphor of this example and the discharge lamp emitting ultraviolet light, the fluorescent lamp and the illumination unit and the display device can be manufactured. Also, by combining the phosphor of this example and an electron beam generator, the display device can be manufactured. Further, by combining the phosphor of this example and the LED light emitting element emitting ultraviolet to visible light as the light emitting part, the illumination unit and the display device can be manufactured.

The illumination unit thus manufactured has the emission spectrum with a broad peak in the range from yellow color to red color (580 nm to 680 nm) and an excellent excitation band on the longer wavelength side from the near ultraviolet/ultraviolet, which is the range of the excitation light, to the visible light (250 nm to 550 nm), and has an improved emission intensity.

Particularly, in the white LED illumination obtained by combining the phosphor according to this example, the phosphor of other color (such as yellow phosphor), and a blue LED or an ultraviolet LED, the light emitting device exhibiting a significantly preferable color rendering property having the average color rendering index Ra of 80 or more, particularly R15 of 80 or more, and R9 of 60 or more of the light emitting device can be obtained, by mixing the phosphors according to the present invention under the correlated color temperature of the light emitting device set in the range from 7000K to 2500K. Further preferably, when the light emitting device is caused to exhibit the aforementioned color rendering property, the blending amount of the red phosphor according to the present invention may be 20% or less with respect to the phosphor of other color. As a result, the blending amount of the phosphor of other color can be gained, and this contributes to obtaining the light emitting device with excellent color rendering property having Ra set at 80 or more can be obtained, without deteriorating the emission efficiency of the yellow phosphor or the like.

EXAMPLE

Comparative Example 1

As a comparative example 1, commercially available $Ca_3N_2$(2N), AlN(3N and having the average particle size of 1.76 μm), $Si_3N_4$ (3N and having the average particle size of 0.774 μm), and $Eu_2O_3$(3N) were prepared, and each raw material was weighed to obtain 0.985/3 mol of $Ca_3N_2$, 1 mol of AlN, 1/3 mol of $Si_3N_4$, and 0.015/2 mol of $Eu_2O_3$, and the raw materials thus weighed were placed in the glove-box under the nitrogen atmosphere and mixed by using the mortar. The raw materials thus mixed were put in a $Si_3N_4$ crucible, and retained/fired for 3 hours at 1500° C. in the nitrogen atmosphere, with pressure in the furnace set at 0.5 kgf/cm². Thereafter, the temperature was cooled from 1500° C. to 200° C. for 1 hour. Then, the raw materials were pulverized after firing, and the phosphor expressed by the composition formula $Ca_{0.985}AlSiN_3:Eu_{0.015}$ was obtained. Note that this composition formula is estimated from the raw material used and the blending ratio.

The phosphor thus obtained was irradiated with the excitation light of monochromatic light with 460 nm wavelength, and the emission characteristic was measured. The peak wavelength in items of the emission characteristics refers to the wavelength of the peak where highest emission intensity is shown in the emission spectrum by nm unit. The emission intensity in the peak wavelength is shown by the relative intensity, and the intensity of the comparative example 1 is standardized as 100%. Chromaticity x, y is obtained by a calculation method defined by the JISZ8701. The boron concentration contained in a phosphor particle sample is the value obtained by measuring by an absorption photometry.

The composition formula of the phosphor, an analysis result of the boron concentration, emission characteristics (peak wavelength, emission intensity, and chromaticity), and powder characteristics (particle size and specific surface area BET) are shown in FIG. 1.

Examples 1 to 4

In the examples 1 to 4, the phosphor sample is manufactured in the same way as the comparative example 1, excepting that the boron nitride BN (3N) is added as the additive agent other than each raw material of $Ca_3N_2$ (2N), AlN(3N), $Si_3N_4$(3N), and $Eu_2O_3$ (3N), and the crucible is changed from the $Si_3N_4$ crucible to a BN crucible.

Specifically, in the example 1, 0.1 wt % of BN powder is added in a mixed raw material (before firing) of $Ca_{0.985}AlSiN_3:Eu_{0.015}$. Similarly, 0.5 wt % of the BN powder is added in the example 2, 1.0 wt % of the BN powder is added in the example 3, and 2.0 wt % of the BN powder is added in the example 4, respectively.

In the examples 1 to 4 also, in the same way as the comparative example 1, the composition formula of the phosphor, the analysis result of the boron concentration, and the measurement result of the emission characteristics (peak wavelength, emission intensity, and chromaticity) and the powder characteristics (particle size and specific surface area BET) are shown in FIG. 1, and the relation between the boron content and the relative emission intensity (the relative intensity of the emission intensity of the comparative example 1 is defined as 100%) is shown in FIG. 2.

From FIG. 1, it is confirmed that by adding the BN powder, the boron content is increased. Although the boron content of the comparative example 1 is not more than 0.0001 wt %, the boron content is increased when the BN powder is added in the examples 1 to 4, in such a way that 0.063 wt % of the boron content is obtained when 0.1 wt % of the BN powder is added, 0.170 wt % of the boron content is obtained when 0.5 wt % of the BN powder is added, 0.310 wt % of the boron content is obtained when 1.0 wt % of the BN powder is added, and 0.640 wt % of the boron content is obtained when 2.0 wt % of the BN powder is added.

Also, it is confirmed from FIG. 1 and FIG. 2, by containing the boron, the emission intensity is improved. The emission intensity is increased having a peak in the range from 0.15 wt % to 0.35 wt % of the boron content, and is increased by 19.6% compared to that of the comparative example 1 without BN addition. In addition, by containing the boron, the peak wavelength is liable to shift toward the longer wavelength side. Further, when the boron content is not more than 0.310 wt % (examples 1 to 3), the average particle size is approximately the same as that of the comparative example 1 without BN addition. However, when the boron content is 0.640 wt % (example 4), the average particle size becomes 10.58 μm, and two times of the size is obtained, compared to the size of the comparative example 1 (5.851 μm) without BN addition. From this result, in the phosphor containing the boron in a certain range, it appears that the reaction is accelerated, and the emission intensity is improved.

Examples 5 to 7

In the examples 5 to 7, in the same way as the comparative example 1, the phosphor sample is manufactured by adding fluorine calcium $CaF_2$(3N) as an additive agent, in addition to each raw material of $Ca_3N_2$(2N), AlN(3N), $Si_3N_4$(3N), $Eu_2O_3$(3N) explained in the comparative example 1, and further by changing the crucible from the $Si_3N_4$ crucible to the BN crucible.

Specifically, in the example 5, 0.025 mol of $CaF_2$ is added to the raw material, with which 1.0 mol of $Ca_{0.985}AlSiN_3$:$Eu_{0.015}$ is obtained. In the same way, 0.050 mol of $CaF_2$ is added in the example 6, and 0.100 mol of $CaF_2$ is added in the example 7.

Figure 4:
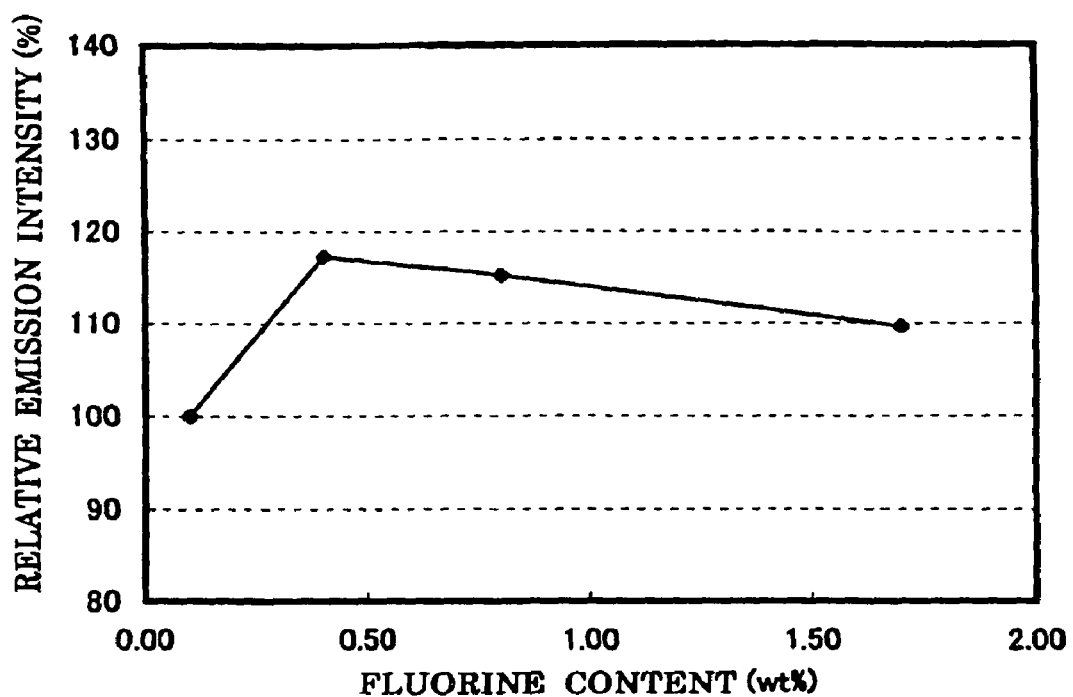
FIG. 4 is a graph showing the relation between the fluorine content and the relative emission intensity in the phosphor of FIG. 3.

In the comparative example 1 and the examples 5 to 7, the composition formula of each phosphor, the analysis result of the fluorine concentration, the measurement result of the emission characteristics (peak wavelength, emission intensity, and chromaticity) and the powder characteristics (particle size and specific surface area BET) are shown in FIG. 3, and the relation between the fluorine content and the relative emission intensity (the relative intensity of the emission intensity of the comparative example 1 is defined as 100%) is shown in FIG. 4.

It is confirmed from FIG. 3 that the fluorine content is increased by adding $CaF_2$ powder. Although not more than 0.10 wt % of fluorine content is contained in the comparative example 1, the fluorine content is increased when $CaF_2$ powder is added in the examples 5 to 7, respectively, wherein 0.40 wt % of the fluorine content is obtained when 0.025 mol of $CaF_2$ powder is added, 0.80 wt % of fluorine content is obtained when 0.050 mol of $CaF_2$ powder is added, and 1.70 wt % of fluorine content is obtained when 0.100 mol of $CaF_2$ powder is added.

Also, in the same way as the case of the boron, it is confirmed from FIGS. 3 and 4, that by containing the fluorine, the emission intensity is improved. The emission intensity is gradually improved up to 0.40 wt % of the fluorine content, and is decreased when the fluorine content exceeds 0.40 wt %. Further, the emission intensity is improved having a peak at 0.40 wt % of the fluorine content, thereby showing 17.3% of improvement compared to case of the comparative example 1 without $CaF_2$ addition. Further, by containing the fluorine, the peak wavelength is liable to shift toward the longer wavelength side. Further, when the fluorine content is not more than 1.70 wt %, the average particle size was the same as that of the comparative example 1 without BN addition. From this result, in the same way as the boron, in the phosphor containing the fluorine in a certain range also, it appears that the reaction is accelerated, and the emission intensity is improved.

Example 8

By the method explained in this embodiment, metal Ca with 99.5% of purity and 90 ppm content of the element Fe was heated in the nitrogen atmosphere at 700° C., then the metal thus heated was pulverized, and $Ca_3N_2$ was thereby manufactured. The content of the element Fe of the $Ca_3N_2$ thus manufactured was 60 ppm. The $Ca_3N_2$ thus manufactured and other raw materials are weighed to obtain the ratio of 0.980/3 mol of $Ca_3N_2$, 1/3 mol of $Si_3N_4$, 1 mol of AlN, and 0.020/2 mol of $Eu_2O_3$, then mixed in the mortar and fired at 1600° C. for 3 hours with pressure of 0.05 MPa in the nitrogen atmosphere, and a red phosphor $CaAlSiN_3$:Eu was manufactured. During firing, the nitrogen is ventilated at 1.0 L/min. As shown in table 1, the contents of the element Fe of the $Ca_3N_2$, $Si_3N_4$, AlN, and $Eu_2O_3$ were 60 ppm, 20 ppm, 90 ppm, and 10 ppm, respectively.

Figure 5:
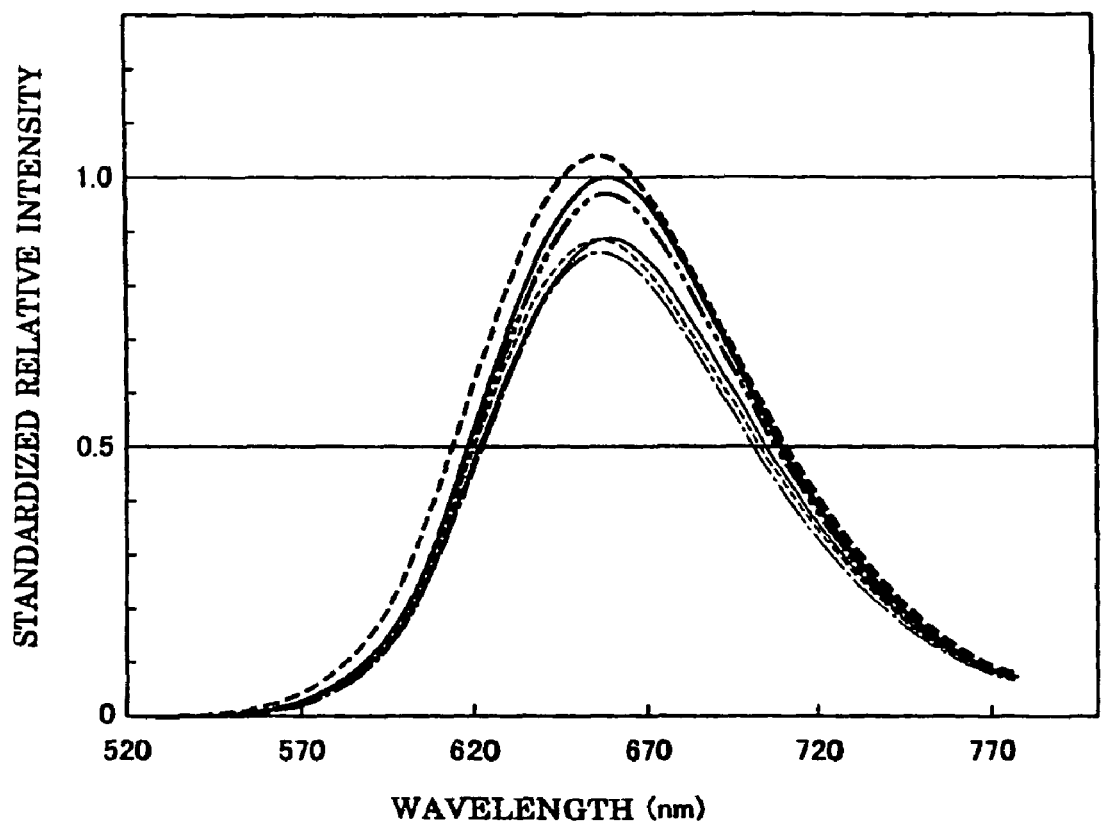
FIG. 5 is an emission spectrum of the phosphor according to an example and a comparative example of the present invention.

FIG. 5 shows the emission spectrum of the phosphor powders manufactured by the example 8 and the examples 9 to 10 as will be described later and the comparative examples 2 to 4, respectively, showing the emission wavelength taken on the abscissa axis, and the relative emission intensity taken on the ordinate axis. In FIG. 5, the emission intensity of the example 8 is standardized as 1, and the relative emission intensity of other example is obtained.

As shown by a thick line of FIG. 5, when the phosphor powder of the example 8 thus obtained was irradiated with monochromatic light of 460 nm wavelength, the phosphor powder emitted red light having the emission spectrum with a peak at 656 nm and a half value width of 50 nm or more. In addition, as shown in table 1 and FIG. 6, the content of the element Fe, which is an impurity of the phosphor of the example 8, obtained by chemical analysis, was 100 ppm.

Figure 6:
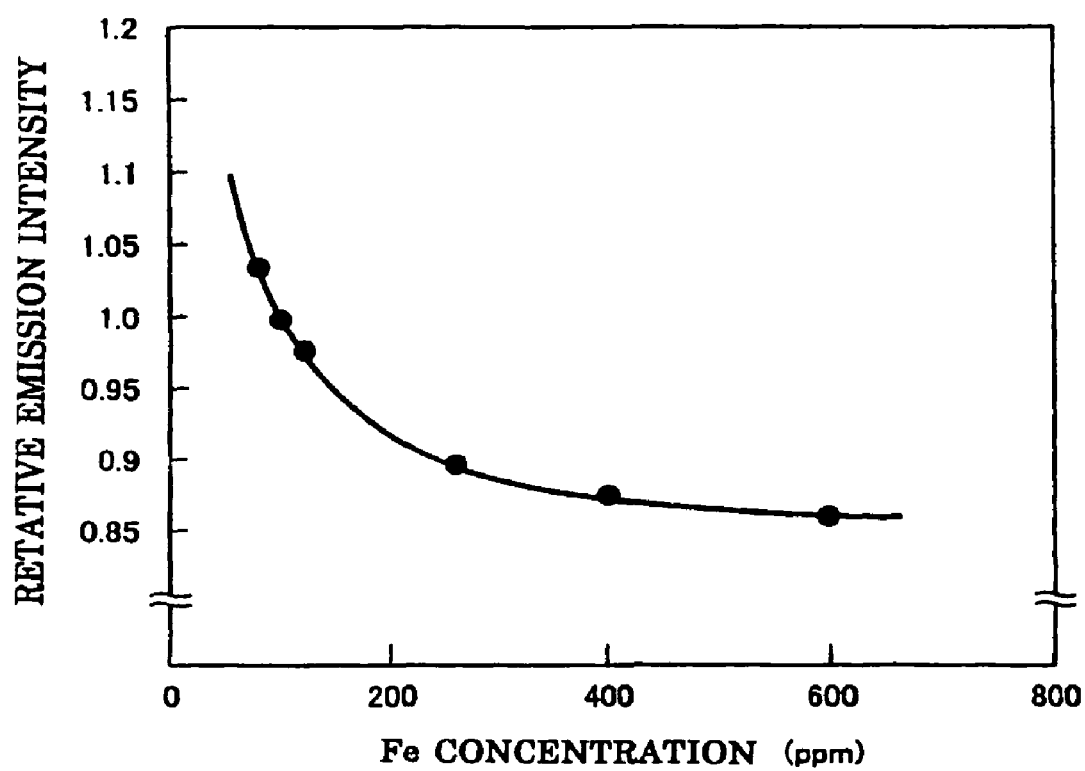
FIG. 6 is a graph showing Fe concentration and the relative emission intensity according to the example and the comparative example of the present invention.

The aforementioned FIG. 6 shows the relative emission intensity to the concentration of impurity element Fe of the phosphor manufactured by the example 8, the examples 9 to 10 as will be described later, and the comparative examples 2 to 4, wherein the emission intensity of the example 8 is standardized as 1, and then the relative emission intensity of other example and comparative example is obtained.

Also, the table 1 shows the concentration of the impurity element Fe obtained by the chemical analysis of $Ca_3N_2$(2N), $Si_3N_4$(3N), AlN(3N), and $Eu_2O_3$(3N), which are raw materials of the phosphor manufactured in the example and the comparative example, the relative emission intensity of the phosphor manufactured by the example and the comparative example, and the content of the impurity Element Fe obtained by the chemical analysis. The relative emission intensity of other example and the comparative example is obtained by standardizing the emission intensity of the example 8 as 1.

TABLE 1

|  | Fe CONCENTRATION IN RAW MATERIAL | | | | PRODUCT | |
|---|---|---|---|---|---|---|
|  | $Ca_3N_2$ (ppm) | $Si_3N_4$ (ppm) | AlN (ppm) | $E_2O_3$ (ppm) | Fe CON- CENTRA- TION (ppm) | EMISSION INTENSITY (RELATIVE INSTEN- SITY) |
| EXAMPLE 8 | 60 | 20 | 90 | 10 | 100 | 1.000 |
| EXAMPLE 9 | 27 | 20 | 90 | 10 | 80 | 1.035 |
| EXAMPLE 10 | 70 | 20 | 90 | 10 | 120 | 0.977 |
| COMPARATIVE EXAMPLE 2 | 230 | 20 | 90 | 10 | 260 | 0.895 |
| COMPARATIVE EXAMPLE 3 | 770 | 20 | 90 | 10 | 400 | 0.872 |
| COMPARATIVE EXAMPLE 4 | 1400 | 20 | 90 | 10 | 600 | 0.862 |

Example 9

As shown in the table 1, the red phosphor $CaAlSiN_3$:Eu was manufactured under the same condition as that of the example 8, other than using $Ca_3N_2$ raw material having lower content of the element Fe than that of the example 8. The contents of the element Fe of $Ca_3N_2$, $Si_3N_4$, AlN, and $Eu_2O_3$ used in the raw materials were 27 ppm, 20 ppm, 90 ppm, and 10 ppm, respectively.

When the phosphor powder thus obtained was irradiated with the monochromatic light of 460 nm, as shown in a thick broken line of FIG. 5, the phosphor powder emitted red light having the emission spectrum with a peak at 656 nm and the half value width of 50 nm or more. Also, as shown in the table 1 and FIG. 6, the content of the impurity element Fe of the phosphor thus obtained by the chemical analysis was 80 ppm.

Example 10

As shown in the table 1, the red phosphor $CaAlSiN_3$:Eu was prepared under the same condition as that of the example 8, other than using $Ca_3N_2$ raw material having 10 ppm more content of the element Fe than that of the example 8. The contents of the element Fe of the $Ca_3N_2$, $Si_3N_4$, AlN, $Eu_2O_3$ were 70 ppm, 20 ppm, 90 ppm, and 10 ppm.

When the phosphor powder thus obtained was irradiated with the monochromatic light of 460 nm, as shown by a thick two-dot line in FIG. 5, the phosphor powder emitted red light having the emission spectrum with a peak at 656 nm and a half value width of 50 nm or more. Also, as shown in the table 1 and FIG. 6, the content of the impurity element Fe of the phosphor thus obtained by the chemical analysis was 120 ppm.

In the next comparative examples 2 to 4, the emission intensity of the phosphor was examined and compared to that of the examples 8 to 10, when $Ca_3N_2$ having more content of the element Fe than that used as the raw material in the example.

Comparative Example 2

As shown in the table 1, the red phosphor $CaAlSiN_3$:Eu was prepared under the same condition as that of the example 8, other than using $Ca_3N_2$ raw material having 230 ppm content of the element Fe. The contents of the element Fe of $Si_3N_4$, AlN, $Eu_2O_3$, which were other raw materials, were 20 ppm, 90 ppm, and 10 ppm, respectively.

When the phosphor powder thus obtained was irradiated with the monochromatic light of 460 nm, as shown by a thin solid line of FIG. 5, the phosphor powder emitted red light having the emission spectrum with a peak at 656 nm and a half value width of 50 nm or more. Also, as shown in the table 1 and FIG. 6, the content of the impurity element Fe of the phosphor obtained by the chemical analysis was 260 ppm.

Comparative Example 3

As shown in the table 1, the red phosphor $CaAlSiN_3$:Eu was prepared under the same condition as that of the example 8, other than using the commercially available $Ca_3N_2$ raw material having 770 ppm content of the element Fe. The contents of the element Fe of $Si_3N_4$, AlN, $Eu_2O_3$, which were other raw materials, were 20 ppm, 90 ppm, and 10 ppm, respectively.

When the phosphor powder thus obtained was irradiated with the monochromatic light of 460 nm, as shown by the thin broken line of FIG. 5, the phosphor powder emitted red light having the emission spectrum with a peak at 656 nm and a half value width of 50 nm or more. Also, as shown in the table 1 and FIG. 6, the content of the impurity element Fe of the phosphor obtained by the chemical analysis was 400 ppm.

Comparative Example 4

As shown in the table 1, the red phosphor $CaAlSiN_3$:Eu was prepared under the same condition of that of the example 8, other than using $Ca_3N_2$ raw material having 1400 ppm content of the element Fe. The content of the element Fe of $Si_3N_4$, AlN, and $Eu_2O_3$, which were other raw materials were 20 ppm, 90 ppm, and 10 ppm, respectively.

When the phosphor powder thus obtained was irradiated with the monochromatic light of 460 nm, as shown by a thin one-dot chain line of FIG. 5, the phosphor powder emitted red light having the emission spectrum with a peak at 656 nm and half value width of 50 nm or more. Also, as shown in the table 1 and FIG. 6, the content of the impurity element Fe of the phosphor obtained by the chemical analysis was 600 ppm.

Comparison and Examination of the Examples 8 to 10, and the Comparative Examples 2 to 4

It is found that from FIG. 6 and the table 1, the emission intensity is drastically decreased when the content of the element Fe exceeds 200 ppm, in the phosphor powder manufactured in the comparative examples 2 to 4. This is because the element Fe has a bad influence on the emission characteristics as a killer element to largely deteriorate the emission efficiency. Such an action is considered to be caused in such a way that when the content of the element Fe exceeds 200 ppm, energy transfer to the center of the light emission of the phosphor powder is significantly interfered, and as a result, the emission intensity is largely deteriorated. Accordingly, as shown in the examples 8 to 10, by controlling the concentration of the element Fe in the raw material to be 200 ppm or less, the concentration of the element Fe of the phosphor powder is suppressed to be 200 ppm or less. Under this condition, the energy transfer to the center of the light emission of the phosphor powder is not interfered, thereby preventing the deterioration of the emission intensity. This contributes to improving and stabilizing the emission efficiency of the phosphor.

What is claimed is:

1. A phosphor, which is given by a composition formula expressed by $Ca_{0.98}AlSiN_3:Eu_{0.02}$, wherein a content of the element Fe is smaller than 200 ppm.

2. A manufacturing method of the phosphor according to claim 1, comprising steps of:
   each of raw materials of the phosphor is weighed and mixed,
   the mixed raw materials are fired, and
   the fired object obtained by the firing is pulverized up to a predetermined average particle size,
   wherein the raw materials contain 100 ppm or less of element Fe.

3. The manufacturing method of phosphor according to claim 2, wherein a nitride of Group II element expressed by a general formula $M_3N_2$ containing 100 ppm or less of element Fe (where the element M is Ca) is used as the raw material of phosphor.

4. The manufacturing method of phosphor according to claim 3, wherein the nitride of group II element is manufactured by nitriding a simple substance of 2N or more containing 100 ppm or less of element Fe in a nitrogen atmosphere or in an ammonia atmosphere at the temperature of 300° C. or more.

5. A light emitting device comprising the phosphor according to claim 1 and a light emitting part which emits a light having a predetermined wavelength, wherein the phosphor emits a light having a different wavelength from the predetermined wavelength, using a part of the light having the predetermined wavelength as an excitation light.

6. The light emitting device according claim 5, wherein the predetermined wavelength is 300 nm to 550 nm.

* * * * *